(12) United States Patent
Chen et al.

(10) Patent No.: US 9,373,541 B2
(45) Date of Patent: Jun. 21, 2016

(54) HARD MASK REMOVAL SCHEME

(71) Applicant: Taiwan Semiconductor Manufacturing Company, Ltd., Hsin-Chu (TW)

(72) Inventors: Jeng-Shiou Chen, Kaohsiung (TW); Chia-Chun Kao, Tainan (TW); Ming-Hsi Yeh, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/820,674

(22) Filed: Aug. 7, 2015

(65) Prior Publication Data
US 2015/0348834 A1  Dec. 3, 2015

Related U.S. Application Data

(63) Continuation of application No. 13/947,746, filed on Jul. 22, 2013, now Pat. No. 9,142,452.

(51) Int. Cl.
| | | |
|---|---|---|
| H01L 21/44 | (2006.01) | |
| H01L 21/768 | (2006.01) | |
| H01L 21/308 | (2006.01) | |
| H01L 21/02 | (2006.01) | |
| H01L 21/3213 | (2006.01) | |
| H01L 21/311 | (2006.01) | |

(52) U.S. Cl.
CPC .... *H01L 21/76843* (2013.01); *H01L 21/02063* (2013.01); *H01L 21/3085* (2013.01); *H01L 21/32134* (2013.01); *H01L 21/76802* (2013.01); *H01L 21/76814* (2013.01); *H01L 21/76865* (2013.01); *H01L 21/76877* (2013.01); *H01L 21/31144* (2013.01)

(58) Field of Classification Search
USPC ................. 257/E21.171, E21.586, E21.269, 257/E21.279, E21.281, E21.293, E21.422, 257/E21.682, E27.103, E29.129, E29.302, 257/E21.632, E21.009, E21.575, E21.637, 257/E21.648, 298, 306, 310, 369, 532, 751, 257/762, E21.011, E21.16, E21.19, 257/E21.444, E21.495, E21.577, E21.585, 257/E21.59, E23.01, E23.151, E23.152, 257/E27.06

See application file for complete search history.

(56) References Cited

U.S. PATENT DOCUMENTS

| | | | |
|---|---|---|---|
| 2001/0029099 A1 | 10/2001 | Ho et al. | |
| 2002/0008323 A1 | 1/2002 | Watanabe et al. | |
| 2002/0068433 A1 | 6/2002 | Trivedi et al. | |
| 2002/0098682 A1* | 7/2002 | Kim | H01L 21/76843 438/627 |
| 2007/0041076 A1* | 2/2007 | Zhong | B81B 3/0072 359/290 |
| 2008/0318411 A1 | 12/2008 | Tsutsue | |
| 2011/0241184 A1 | 10/2011 | Han et al. | |
| 2012/0309189 A1* | 12/2012 | Park | H01L 21/31144 438/643 |

FOREIGN PATENT DOCUMENTS

| | | |
|---|---|---|
| JP | 2009004665 | 1/2009 |
| KR | 1020080001905 | 1/2008 |

* cited by examiner

*Primary Examiner* — Robert Bachner
(74) *Attorney, Agent, or Firm* — Slater Matsil, LLP

(57) ABSTRACT

A method includes forming a barrier layer in a via hole and over a hard mask layer. The hard mask layer is disposed over a dielectric layer. The via hole is located through the dielectric layer and the hard mask layer. A filler layer is formed in the via hole and over the barrier layer. The filler layer and the hard mask layer are removed. A metal layer is formed in the via hole.

20 Claims, 5 Drawing Sheets

__US 9,373,541 B2__

HARD MASK REMOVAL SCHEME

This application is a continuation of U.S. patent application Ser. No. 13/947,746, filed Jul. 22, 2013, and entitled "Hard Mark Removal Scheme," which is incorporated herein by reference.

TECHNICAL FIELD

The present disclosure relates generally to an integrated circuit and more particularly a hard mask removal scheme.

BACKGROUND

In some integrated circuit fabrication, a hard mask layer in a via structure is removed for metal filling. As the integrated circuit size shrinks, the hard mask removal tends to be helpful to reduce the aspect ratio of the via hole for better via hole metal filling. However, some conventional hard mask removal method may result in via bottom metal damage.

BRIEF DESCRIPTION OF THE DRAWINGS

Reference is now made to the following descriptions taken in conjunction with the accompanying drawings, in which.

DETAILED DESCRIPTION

Figure 1A:
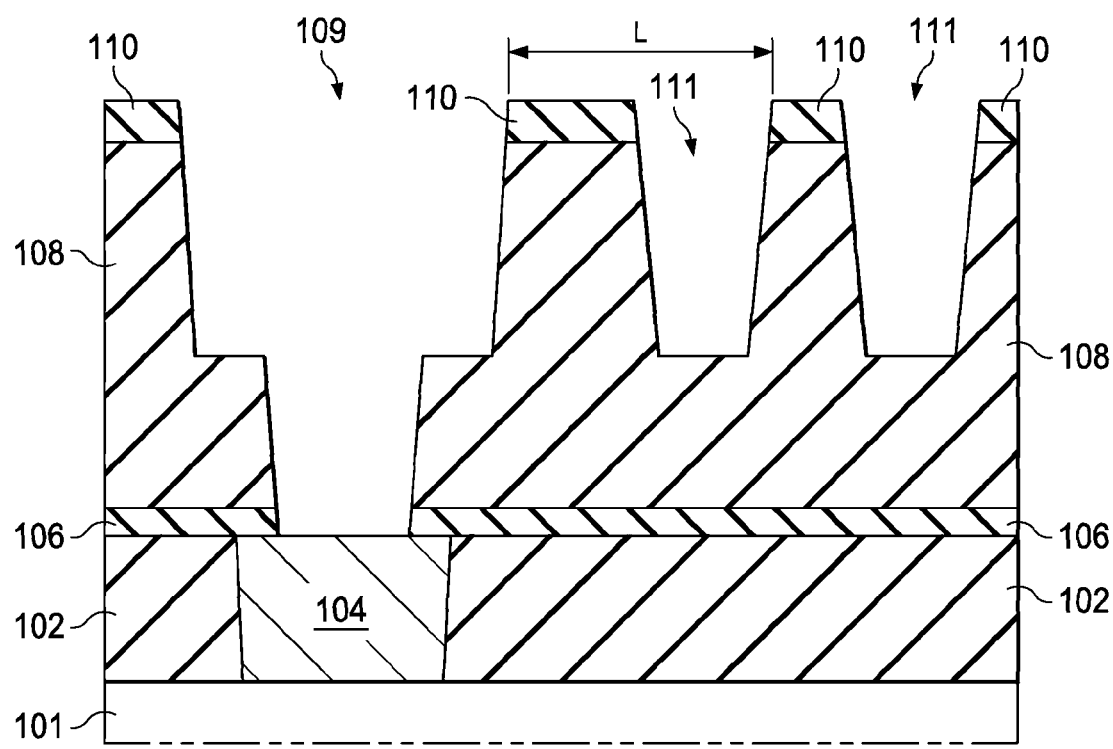
FIGS. 1A-1D are intermediate steps of an exemplary hard mask removal scheme for a via structure according to some embodiments.

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIGS. 1A-1D are intermediate steps of an exemplary hard mask removal scheme for a via structure according to some embodiments. In FIG. 1A, a substrate 101 is shown in dotted line and a dielectric layer 102 and a via bottom metal layer 104 is disposed over the substrate 101. The substrate 101 comprises silicon, silicon dioxide, aluminum oxide, sapphire, germanium, gallium arsenide (GaAs), an alloy of silicon and germanium, indium phosphide (InP), silicon on insulator (SOI), or any other suitable material. The substrate 101 is omitted in subsequent figures for simplicity.

The dielectric layer 102 comprises a low-k dielectric material with the dielectric constant k in the range from 1.5 to 2.8 (such as SiOCH), and can be formed by a chemical vapor deposition (CVD) in some embodiments. The via bottom metal layer 104 comprises copper or any other suitable material. In some embodiments, the via bottom metal layer 104 can be formed by a seed layer deposition using physical vapor deposition (PVD) followed by electroplating the metal. In some examples, the via bottom metal layer 104 has a thickness of about 200 nm.

An etch stop layer (ESL) 106 is disposed over the dielectric layer 102 and the via bottom metal layer 104. The ESL 106 comprises SiO, SiC, SiN, SiOC, SiON, SiCN, TiN, or $AlO_XN_Y$ with a thickness ranging from about 10 Å to about 300 Å, and can be formed by CVD in some embodiments.

Another dielectric layer 108 is disposed over the ESL 106. The dielectric layer 108 is similar to the dielectric layer 102, i.e., the dielectric layer 108 comprises a low-k dielectric material with the dielectric constant k in the range from about 1.5 to about 2.8 (such as SiOCH), and can be formed by a chemical vapor deposition (CVD) in some embodiments. The dielectric layer 108 is formed in a via layer or in a combination of a via layer and a metal layer in some embodiments.

A hard mask layer 110 is disposed over the dielectric layer 108. The hard mask layer 110 comprises TiN and has a thickness ranging from about 10 Å to about 600 Å, and can be formed by CVD in some embodiments. A via hole 109 and trenches 111 are formed in the dielectric layer 108 by a photolithography process followed by dry etching and wet cleaning, for example. In some embodiments, the via hole 109 and the trenches 111 have a minimum pitch L that is less than 90 nm and have an aspect ratio (height/width) greater than about 5. In one example, the via hole 109 has a width of about 40 nm and a height of about 200 nm.

Figure 1B:
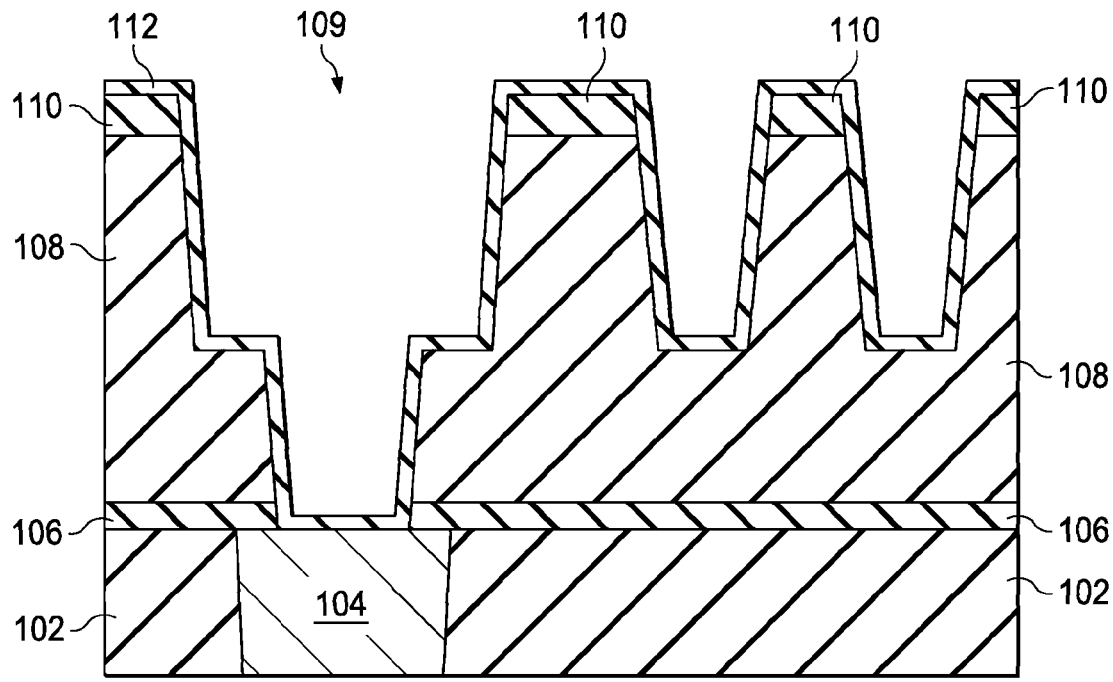

In FIG. 1B, a barrier layer 112 is formed in the via hole 109 (and trenches 110) and over the hard mask layer 110 and the dielectric layer 108. The barrier layer 112 protects the via bottom metal layer 104. The barrier layer 112 may also, in some embodiments, inhibit diffusion of a subsequently formed conductive feature into the surrounding dielectric layer 108. In some embodiments, the barrier layer 112 is formed by PVD or atomic layer deposition (ALD). In some embodiments, the barrier layer 112 comprises Ta, TaN, Co, Ru, Mn, or any other suitable material, and has a thickness ranging from about 1 Å to about 50 Å.

Figure 1C:
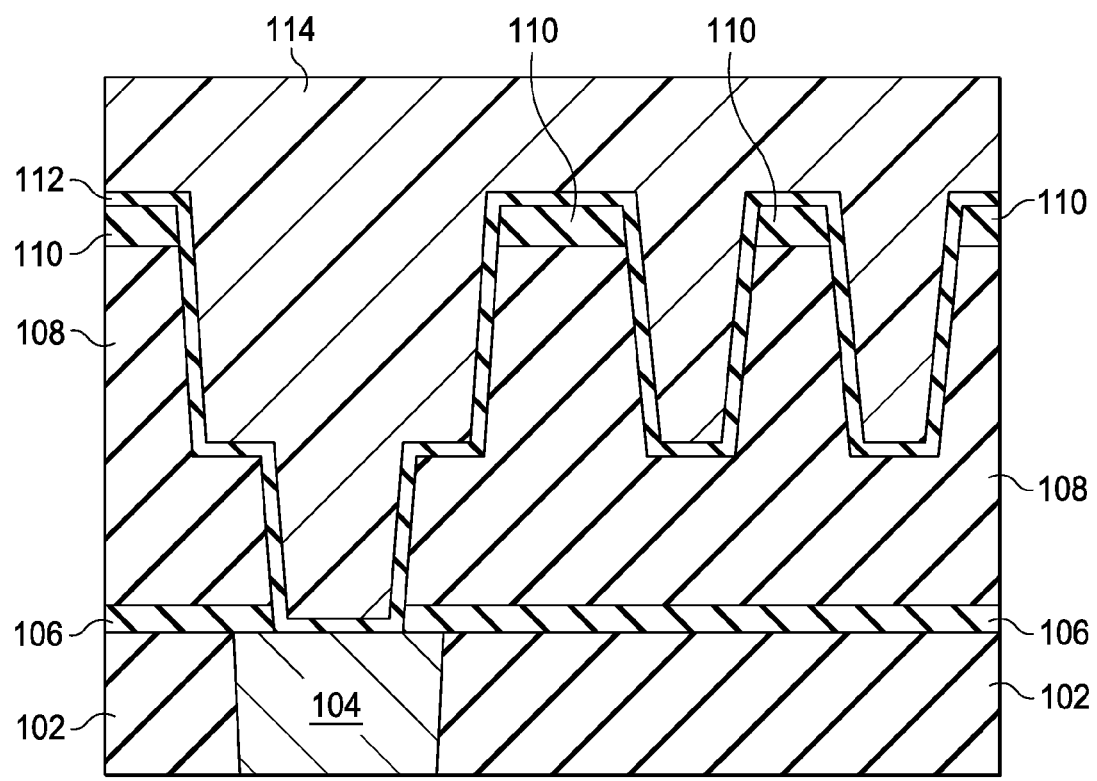

In FIG. 1C, a filler layer 114 is formed in the via hole 109 (and trenches 111) and over the barrier layer 112. The filler layer 114 comprises SiOx, SiOC, SiOH, SiOCH, other carbon-containing polymers, a low-k dielectric, extra low-k dielectric, Undoped Silicate Glass (USG), black-diamond, any combination thereof, or any other suitable material. The filler layer 114 can be formed by CVD, for example.

Using the filler layer 114 prevents the via hole 109 and the trenches 111 from collapse or distortion during the following step, e.g., a polishing process such as chemical mechanical polishing (CMP) process. Also, by choosing the proper hardness of the filler layer 114, it can help the CMP process to improve uniformity and to control the thickness of hard mask layer 110 (e.g., TiN) left on the top.

Figure 1D:
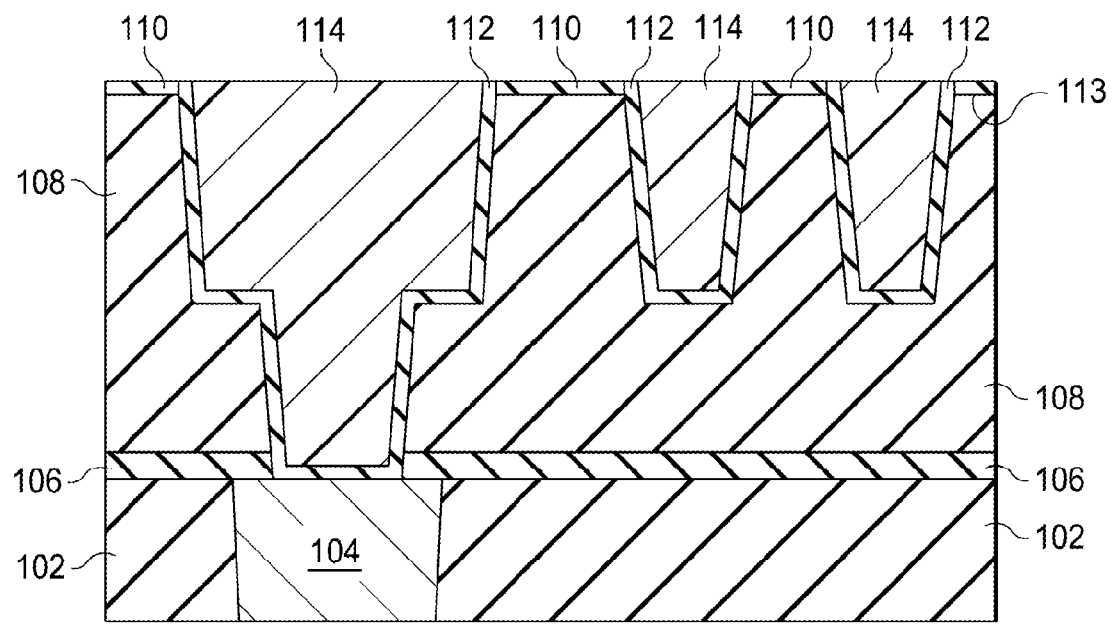

In FIG. 1D, the top portion of the filler layer 114 and the hard mask layer 110 are removed. In some embodiments, a polishing process such as chemical mechanical polishing (CMP) process can be used. The bottom portion 113 of the hard mask layer 110 is left with a thickness ranging from 0.1 nm to 5 nm in some embodiments.

Figure 2A:
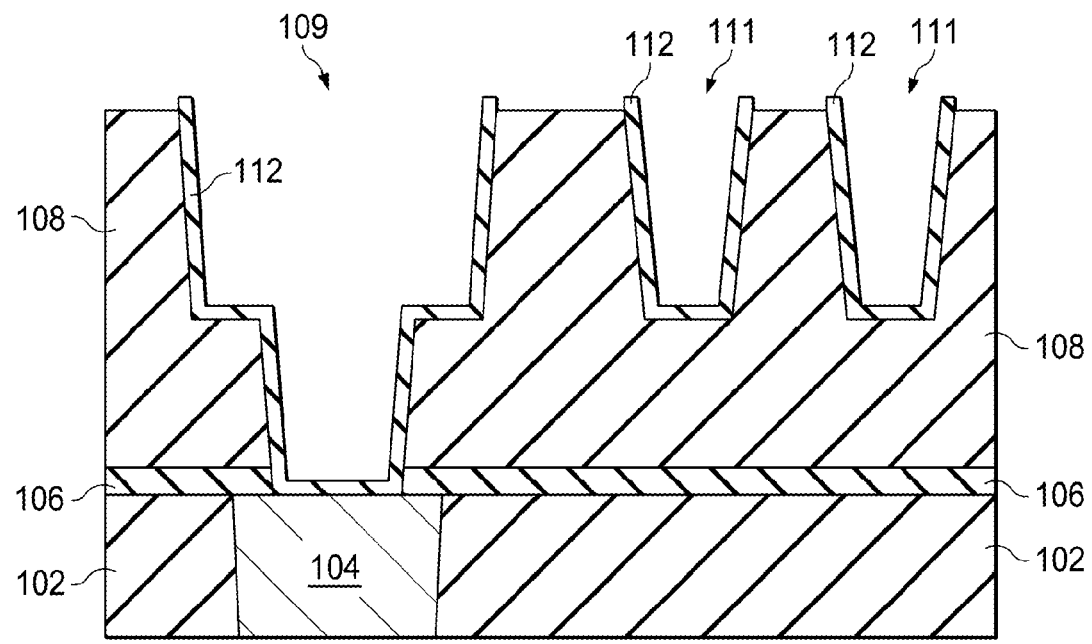
FIGS. 2A-2C are exemplary steps of removing the remaining filler layer and hard mask layer in FIG. 1D according to some embodiments.
Figure 2B:
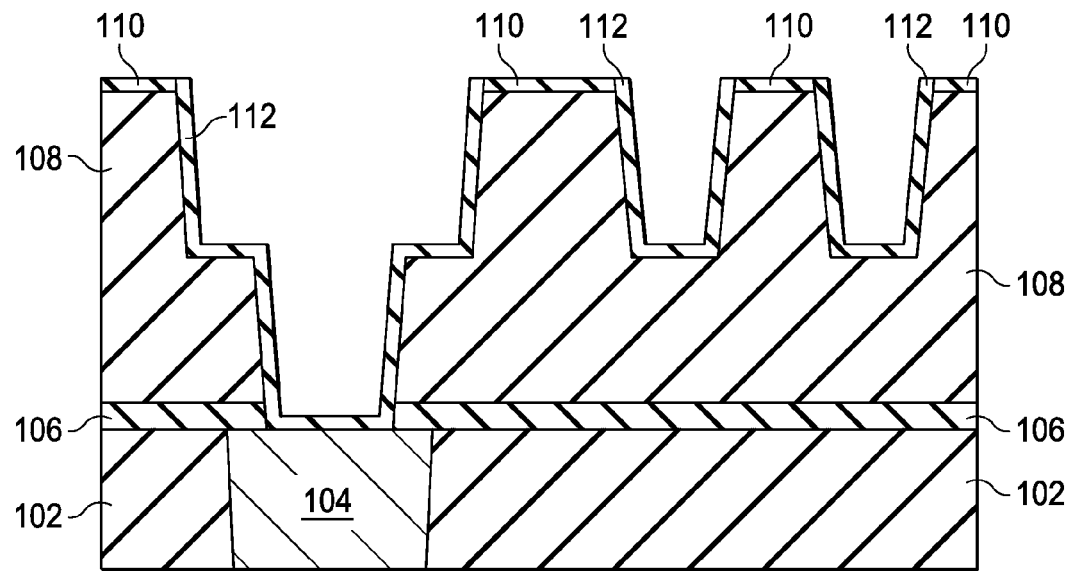
Figure 2C:
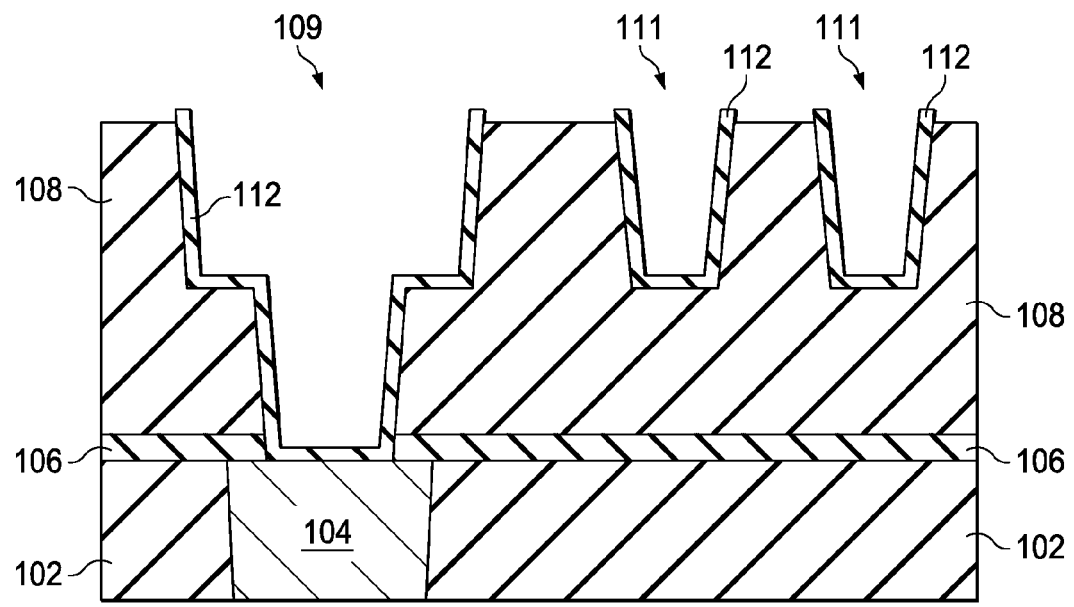

FIGS. 2A-2C are exemplary steps of removing the remaining filler layer 114 and hard mask layer 110 in FIG. 1D according to some embodiments. In FIG. 2A, the bottom portion of the filler layer 114 and the hard mask layer 110 is removed by one wet etching process using a mixture of a chemical containing fluorine to remove the filler layer 114 and another chemical to remove the hard mask layer 110 (such as $H_2O_2$ for the hard mask layer 110 comprising TiN). In some embodiments, the etching process is performed at a temperature of about 70° C. The barrier layer 112 serves as a protector of the via bottom metal layer 104 from damage.

In some other embodiments, the bottom portion of the filler layer 114 and the hard mask layer 110 can be removed separately as shown in FIGS. 2B-2C. In FIG. 2B, the bottom portion of the filler layer 114 is removed by a wet etching process using chemical containing fluorine at a temperature of about 70° C. Alternatively, a vapor etching process can be used, for example, with HF (10%-60%), $NH_3$ (10%-60%), and inert/carrier gas such as Ar, He, Ne, $N_2$, or $CO_2$ (5%-80%) at a reaction temperature ranging from about 30° C. to about 80° C. and a baking temperature ranging from about 100° C. to about 400° C. The barrier layer 112 serves as a protector of the via bottom metal layer 104 from damage.

In FIG. 2C, the bottom portion of the hard mask layer 110 is removed by a wet etching process using a chemical, such as $H_2O_2$ for the hard mask layer 110 comprising TiN. In some embodiments, the etching process is performed at a temperature of about 70° C. The barrier layer 112 serves as a protector of the via bottom metal layer 104 from damage. Also, the barrier layer 112 prevents the dielectric layer 108 from being in contact with wet etching chemical for an extended time, which may reduce the risk of the dielectric constant k-value of the dielectric layer 108 shifting-up.

Figure 3A:
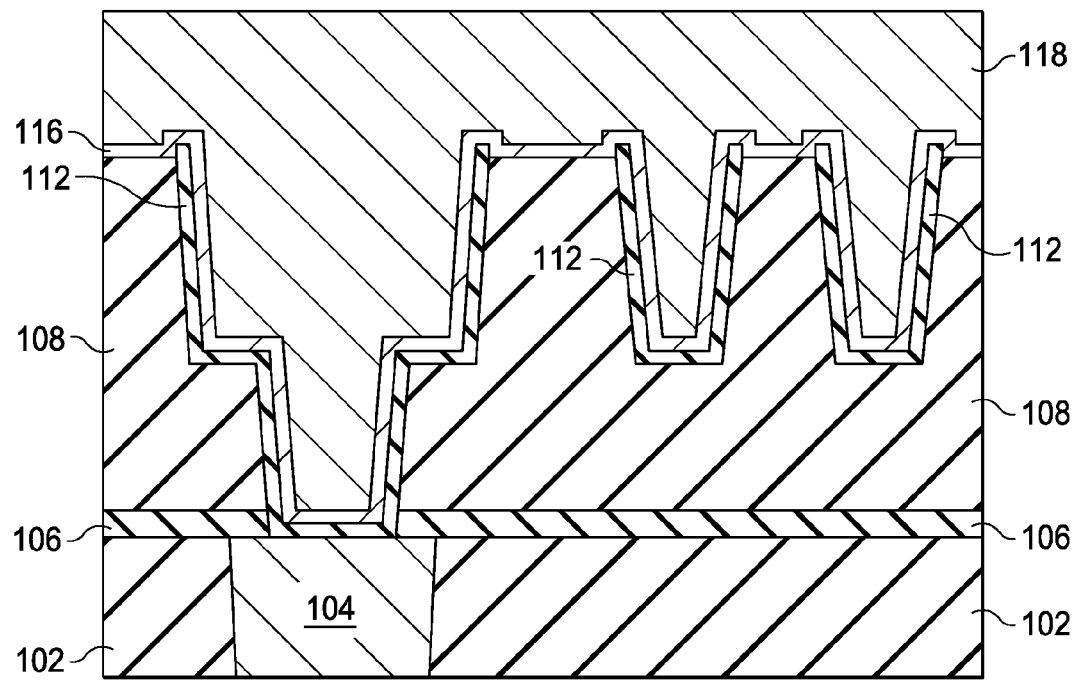
FIGS. 3A-3B are intermediate steps of forming metal layer in the via hole after removing the hard mask layer in FIGS. 2A-2C according to some embodiments.
Figure 3B:
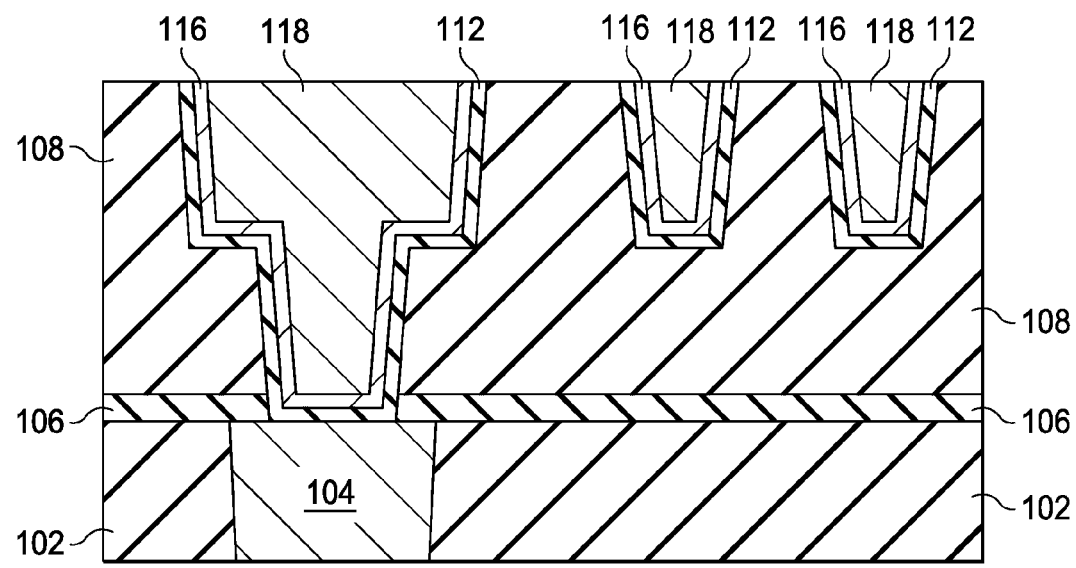

FIGS. 3A-3B are intermediate steps of forming metal layer in the via hole after removing the hard mask layer 110 in FIGS. 2A-2C according to some embodiments. In FIG. 3A, a seed layer 116 is formed over the barrier layer 112 and the dielectric layer 108. For example, a copper seed layer 116 with a thickness ranging from about 1 nm to about 20 nm can be deposited by PVD in some embodiments.

After the seed layer 116 is formed, a metal layer 118 is formed over the seed layer 116 in the via hole 109 (and the trenches 111). For example, a copper electroplating can be used to form the metal layer 118. In FIG. 3B, the metal layer 118 is polished to remove excess material by CMP, for example.

According to some embodiments, a method includes forming a barrier layer in a via hole and over a hard mask layer. The hard mask layer is disposed over a dielectric layer. The via hole is located through the dielectric layer and the hard mask layer and above a via bottom metal layer. A filler layer is formed in the via hole and over the barrier layer. The filler layer and the hard mask layer are removed. A metal layer is formed in the via hole.

According to some embodiments, a method includes forming a barrier layer in a via hole and over a hard mask layer. The hard mask layer is disposed over a dielectric layer. The via hole is located through the dielectric layer and the hard mask layer. A filler layer is formed in the via hole and over the barrier layer. The filler layer and the hard mask layer are removed. A top portion of the filler layer and the barrier layer is removed by a polishing process. A metal layer is formed in the via hole.

According to some embodiments, a method includes forming a dielectric layer over a via bottom metal layer. A hard mask layer is formed over the dielectric layer. A via hole is formed in the dielectric layer. A barrier layer is formed in the via hole and over the hard mask layer. A filler layer is formed in the via hole and over the barrier layer. The filler layer and the hard mask layer are removed. A metal layer is formed in the via hole.

In accordance with an embodiment, a method of forming a semiconductor device is provided. The method includes forming a dielectric layer over a substrate and forming a mask layer over the dielectric layer, the mask layer and the dielectric layer having an opening. A barrier layer is formed along sidewalls and a bottom of the opening, and the mask layer is removed. A metal layer is formed in the opening.

In accordance with yet another embodiment, a method of forming a semiconductor device is provided. The method includes forming a dielectric layer over a substrate, forming a mask layer over the dielectric layer, the mask layer and the dielectric layer having an opening, and forming a barrier layer along sidewalls and a bottom of the opening. A filler material is formed over the barrier layer in the opening. The mask layer is removed, and the filler material is removed. A metal layer is formed in the opening.

In accordance with yet another embodiment, a method of forming a semiconductor device is provided. The method includes forming a dielectric layer over a substrate, the substrate having a conductive feature, forming a mask layer over the dielectric layer, forming an opening in the mask layer and the dielectric layer, the opening exposing the conductive feature, and forming a barrier layer along sidewalls and a bottom of the opening, the barrier layer extending over exposed portions of the conductive feature. A filler material is formed in the opening, and the mask layer and the filler material is removed. A metal layer is formed in the opening.

A skilled person in the art will appreciate that there can be many embodiment variations of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within the scope of the disclosure and will be apparent to those skilled in the art after reviewing this disclosure.

What is claimed is:
1. A method of forming a semiconductor device, the method comprising:
forming a dielectric layer over a substrate;
forming a mask layer over the dielectric layer, the mask layer and the dielectric layer having an opening;

forming a barrier layer along sidewalls and a bottom of the opening;

forming a filler material over the barrier layer;

polishing the filler material and the mask layer to thin the mask layer;

after the polishing, removing remaining portions of the mask layer using an etch process;

after removing the remaining portions of the mask layer, removing the filler material; and forming a metal layer in the opening.

2. The method of claim 1, wherein a thickness of the mask layer after the polishing is from 0.1 nm to about 5 nm.

3. The method of claim 1, wherein the filler material comprises a carbon-containing polymer.

4. The method of claim 1, wherein after removing the remaining portions of the mask layer, the barrier layer extends above an uppermost surface of the dielectric layer.

5. The method of claim 1, wherein the filler material is removed using a vapor etch process.

6. The method of claim 1, wherein the filler material is removed using a wet etch process.

7. The method of claim 1, wherein the barrier layer has a thickness from 1 Å to about 50 Å.

8. The method of claim 1, wherein the polishing is performed at least in part using a chemical mechanical polishing process.

9. A method of forming a semiconductor device, the method comprising:

forming a dielectric layer over a substrate;

forming a mask layer over the dielectric layer, the mask layer and the dielectric layer having an opening;

forming a barrier layer along sidewalls and a bottom of the opening;

forming a filler material over the barrier layer in the opening;

removing the mask layer;

removing the filler material; and forming a metal layer in the opening, wherein the barrier layer extends above an uppermost surface of the dielectric layer after forming the metal layer.

10. The method of claim 9, further comprising polishing the metal layer and the barrier layer such that an upper surface of the metal layer is level with an upper surface of the barrier layer.

11. The method of claim 9, wherein forming the filler material comprises forming the filler material over the mask layer, and further comprising polishing the filler material, the polishing thinning the mask layer.

12. The method of claim 11, wherein a thickness of the mask layer after the polishing is from 0.1 nm to about 5 nm.

13. The method of claim 9, wherein the removing the mask layer and the removing the filler material is performed in a single etch process.

14. The method of claim 9, wherein removing the mask layer exposes an upper surface of the dielectric layer.

15. A method of forming a semiconductor device, the method comprising:

forming a dielectric layer over a substrate, the substrate having a conductive feature;

forming a mask layer over the dielectric layer;

forming an opening in the mask layer and the dielectric layer, the opening exposing the conductive feature;

forming a barrier layer along sidewalls and a bottom of the opening, the barrier layer extending over exposed portions of the conductive feature;

forming a filler material in the opening;

after forming the filler material, removing the mask layer to expose the dielectric layer, wherein after the removing the mask layer, the barrier layer extends above an uppermost surface of the dielectric layer;

removing the filler material; and forming a metal layer in the opening.

16. The method of claim 15, wherein the removing the filler material and the mask layer is performed by a single wet etch process.

17. The method of claim 15, wherein the removing the filler material and the mask layer comprise:

removing the filler material using a first wet etch process; and removing the mask layer using a second wet etch process.

18. The method of claim 15, wherein the removing the filler material and the mask layer comprise:

removing the filler material using a vapor etch process; and removing the mask layer using a second wet etch process.

19. The method of claim 15, wherein forming the barrier layer comprises forming a conductive barrier layer and forming the metal layer comprises forming the metal layer on the conductive barrier layer.

20. The method of claim 15, wherein removing the mask layer is performed is performed at least in part using a chemical mechanical polishing process.

* * * * *